United States Patent
Lee et al.

(10) Patent No.: US 10,361,264 B2
(45) Date of Patent: Jul. 23, 2019

(54) METHOD FOR DRIVING DUAL-MEDIA DISPLAY PANEL, AND ELECTRONIC DEVICE AND DISPLAY SYSTEM USING THE SAME

(71) Applicants: INDUSTRIAL TECHNOLOGY RESEARCH INSTITUTE, Hsinchu (TW); Intellectual Property Innovation Corporation, Hsinchu (TW)

(72) Inventors: Cheng-Chung Lee, Hsinchu (TW); Kuang-Jung Chen, Zhubei (TW); Heng-Yin Chen, Zhubei (TW); Sheng-Po Wang, Zhongli (TW); Tzu-Yi Yu, Kaohsiung (TW)

(73) Assignees: INDUSTRIAL TECHNOLOGY RESEARCH INSTITUTE, Hsinchu (TW); INTELLECTUAL PROPERTY INNOVATION CORPORATION, Hsinchu (TW)

(*) Notice: Subject to any disclaimer, the term of this patent is extended or adjusted under 35 U.S.C. 154(b) by 0 days.

(21) Appl. No.: 15/919,506

(22) Filed: Mar. 13, 2018

(65) Prior Publication Data
US 2019/0198596 A1 Jun. 27, 2019

(30) Foreign Application Priority Data
Dec. 26, 2017 (TW) .............................. 106145673 A

(51) Int. Cl.
*H01L 27/32* (2006.01)
*G09G 3/36* (2006.01)

(52) U.S. Cl.
CPC ....... *H01L 27/3267* (2013.01); *G09G 3/3607* (2013.01); *G09G 2310/0264* (2013.01)

(58) Field of Classification Search
CPC .. G09G 3/3607; G09G 3/2003; G09G 3/2074; G09G 2320/0626; G09G 5/026;
(Continued)

(56) References Cited

U.S. PATENT DOCUMENTS 7,843,402 B2 * 11/2010 Nakadaira .......... G02B 27/2278
345/6
9,594,286 B2 3/2017 Kim et al.
(Continued)

FOREIGN PATENT DOCUMENTS

CN 102682722 A 9/2012
TW 201546520 A 12/2015

*Primary Examiner* — Sardis F Azongha
(74) *Attorney, Agent, or Firm* — Birch, Stewart, Kolasch & Birch, LLP

(57) ABSTRACT

A method for driving a dual-media display panel includes the following. Display data is obtained. A first driving signal for driving a transparent display panel of the dual-media display panel is generated in response to the display data. A display-unit grayscale value for the display data is obtained. The display-unit grayscale value is determined whether it falls within a grayscale value interval. When the display-unit grayscale value is less than a lower limit of the grayscale value interval, a driving signal adapted to enabling the light-shielding display panel to display a black color is used as the second driving signal. When the display-unit grayscale value is greater than an upper limit of the grayscale value interval, a driving signal adapted to enabling the light-shielding display panel to display a white color is used as the second driving signal.

20 Claims, 11 Drawing Sheets

(58) Field of Classification Search
CPC ........ G09G 5/04; H01L 27/3267; H04N 9/00; H04N 9/73
See application file for complete search history.

(56) References Cited

U.S. PATENT DOCUMENTS

| | | | |
|---|---|---|---|
| 9,824,648 B2* | 11/2017 | Hsieh | G09G 3/3607 |
| 2005/0052341 A1 | 3/2005 | Henriksson | |
| 2008/0055535 A1* | 3/2008 | Chiba | C09K 19/60 349/165 |
| 2013/0147851 A1* | 6/2013 | Yim | H01L 27/32 345/690 |
| 2013/0314453 A1* | 11/2013 | Ko | G09G 5/10 345/690 |
| 2014/0184577 A1* | 7/2014 | Kim | G09G 5/10 345/207 |
| 2014/0185129 A1* | 7/2014 | Kim | H01L 51/5284 359/296 |
| 2014/0292825 A1* | 10/2014 | Kim | G09G 3/003 345/690 |
| 2015/0192835 A1 | 7/2015 | Kim et al. | |
| 2015/0228229 A1* | 8/2015 | Priede | G09G 3/003 345/213 |
| 2015/0371579 A1* | 12/2015 | Yu | G09G 3/32 345/690 |
| 2016/0240125 A1* | 8/2016 | Sridharan | G09G 5/02 |
| 2017/0075151 A1 | 3/2017 | Wang et al. | |
| 2017/0098408 A1* | 4/2017 | Hsieh | G09G 3/2074 |
| 2017/0162636 A1* | 6/2017 | Park | H01L 27/3262 |
| 2018/0096643 A1* | 4/2018 | Hsieh | G09G 3/2011 |

\* cited by examiner

METHOD FOR DRIVING DUAL-MEDIA DISPLAY PANEL, AND ELECTRONIC DEVICE AND DISPLAY SYSTEM USING THE SAME

This application claims the benefit of Taiwan application Serial No. 106145673, filed Dec. 26, 2017, the disclosure of which is incorporated by reference herein in its entirety.

TECHNICAL FIELD

The present disclosure relates to a method for driving a display panel and an electronic device and a display system using the same, and also relates to a method for driving a dual-media display panel and an electronic device and a display system using the same.

BACKGROUND

Dual-media display panel technology presents display data by stacking a transparent display panel and a light-shielding display panel together. The transparent display panel may be, for example, a transparent organic light-emitting diode (OLED) display panel which has the advantages of vivid color, high image quality, etc. However, the transparent display panel cannot display the black color. Therefore, the transparent display panel often needs to be used with the light-shielding display panel.

Currently, the method for driving the dual-media display panel is realized by the video source used with algorithms respectively dedicated to the transparent display panel and the light-shielding display panel, so as to convert the RGB image data into driving signals required by the two display panels. However, this method needs to set timing controllers (TCONs) separately for the transparent display panel and the light-shielding display panel, resulting in increased manufacturing costs of the display.

SUMMARY

According to an embodiment of the present disclosure, a method for driving a dual-media display panel is provided. The method, implemented by an electronic device including a processor, includes the following steps. A display data is obtained by the processor. A first driving signal for driving a transparent display panel of the dual-media display panel is generated by the processor in response to the display data. A second driving signal for driving a light-shielding display panel of the dual-media display panel is generated by the processor in response to the display data, wherein said generating the second driving signal includes the following steps. A display-unit grayscale value for the display data is obtained by the processor. The display-unit grayscale value is determined whether falls within a grayscale value interval by the processor, wherein the grayscale value interval, comprised in a maximum grayscale range, is between an upper limit and a lower limit of the grayscale value interval. When the display-unit grayscale value is less than the lower limit, a driving signal adapted to enabling the light-shielding display panel to display a black color is used as the second driving signal by the processor. When the display-unit grayscale value is greater than the upper limit, a driving signal adapted to enabling the light-shielding display panel to display a white color is used as the second driving signal by the processor.

According to another embodiment of the present disclosure, an electronic device adapted to driving a dual-media display panel is provided. The electronic device includes a memory and a processor. The processor is coupled to the memory and configured to: obtain a display data, generate a first driving signal for driving a transparent display panel of the dual-media display panel in response to the display data, and generate a second driving signal for driving a light-shielding display panel of the dual-media display panel in response to the display data. Said generating the second driving signal includes the following steps. A display-unit grayscale value for the display data is obtained. The display-unit grayscale value is determined whether falls within a grayscale value interval, wherein the grayscale value interval, comprised in a maximum grayscale range, is between an upper limit and a lower limit of the grayscale value interval. When the display-unit grayscale value is less than the lower limit, a driving signal adapted to enabling the light-shielding display panel to display a black color is used as the second driving signal. When the display-unit grayscale value is greater than the upper limit, a driving signal adapted to enabling the light-shielding display panel to display a white color is used as the second driving signal.

According to yet another embodiment of the present disclosure, a display system is provided. The display system includes a video source, a transparent display panel, a light-shielding display panel and an electronic device. The video source is configured to provide display data. The light-shielding display panel is stacked on the transparent display panel. The electronic device, coupled to the video source, the transparent display panel and the light-shielding display panel, is configured to drive the transparent display panel and the light-shielding display panel. The electronic device includes a memory and a processor. The processor is coupled to the memory and is configured to obtain the display data, generate a first driving signal for driving the transparent display panel of the dual-media display panel in response to the display data, and generate a second driving signal for driving the light-shielding display panel of the dual-media display panel in response to the display data. Said generating the second driving signal includes the following steps. A display-unit grayscale value for the display data is obtained. The display-unit grayscale value is determined whether falls within a grayscale value interval, wherein the grayscale value interval, comprised in a maximum grayscale range, is between an upper limit and a lower limit of the grayscale value interval. When the display-unit grayscale value is less than the lower limit, a driving signal adapted to enabling the light-shielding display panel to display a black color is used as the second driving signal. When the display-unit grayscale value is greater than the upper limit, a driving signal adapted to enabling the light-shielding display panel to display a white color is used as the second driving signal.

For a better understanding of the above and other aspects of the present disclosure, the embodiments are described below in detail with reference to the accompanying drawings:

DETAILED DESCRIPTION

According to the embodiments of the present disclosure, a method for driving a dual-media display panel and an electronic device and a display system using the same are provided. The dual-media display panel may include a transparent display panel and a light-shielding display panel stacked on each other. By driving both the transparent display panel and the light-shielding display panel at the same time, the dual-media display panel presents data to be displayed. In the embodiments of the present disclosure, the method for driving the dual-media display panel may be implemented by an electronic device. For example, the electronic device includes a memory and a processor. The memory may store programs, instructions, data or files that are accessible or executable for the processor. The processor is coupled to the memory and is configured to execute the method for driving the dual-media display panel according to the embodiments of the present disclosure. For example, the processor may be implemented as a microcontroller, a microprocessor, a digital signal processor, an application specific integrated circuit (ASIC), a digital logic circuit, a field programmable gate array (FPGA), or hardware component(s) with computing and processing functions. In an example, the electronic device may be implemented as a timing controller coupled between the video source and the dual-media display panel. In another example, the electronic device may be integrated into the video source and implemented as a part of the video source.

Figure 1:
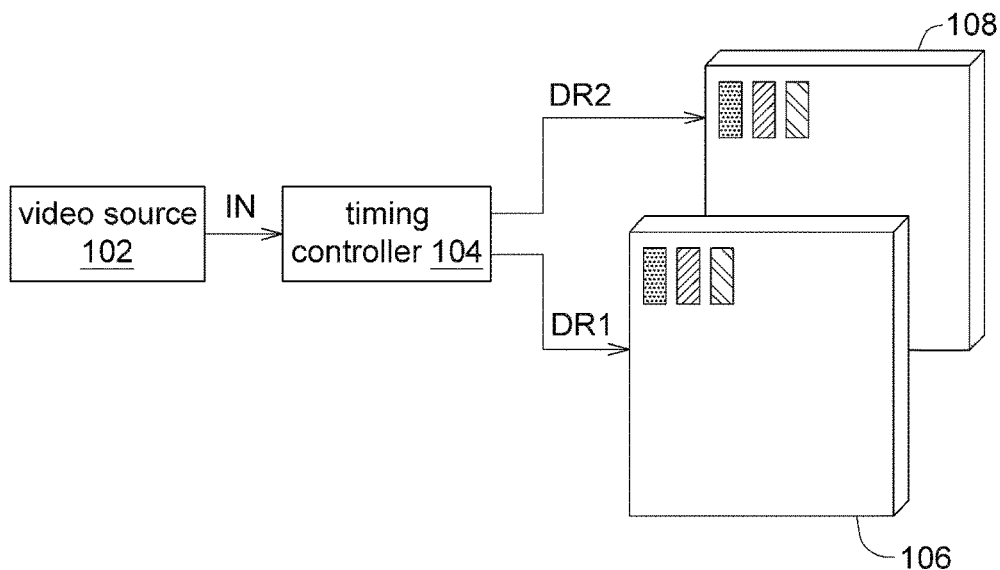
FIG. 1 is a schematic diagram of a display system according to an embodiment of the present disclosure.

FIG. 1 is a schematic diagram of a display system 10 according to an embodiment of the present disclosure. The display system 10 includes a video source 102, a timing controller 104, a transparent display panel 106 and a light-shielding display panel 108. The transparent display panel 106 may be a self-emissive transparent display panel, such as a transparent AMOLED display panel, a micro LED display panel, or the like. The light-shielding display panel 108 may be a liquid crystal display (LCD) panel or an electrochromic (EC) display panel. The transparent display panel 106 and the light-shielding display panel 108 are stacked on each other to form a dual-media display panel. The light-shielding display panel 108 may cooperate with the transparent display panel 106 and display a suitable grayscale, such as black, gray or white.

The video source 102 is configured to provide the display data IN. The display data IN is the image content that is to be displayed on the dual-media display panel. In an example, the display data IN may be pixel data.

The timing controller 104 may receive the display data IN from the video source 102 and respond to the display data IN to generate a first driving signal DR1 for the transparent display panel 106 and a second driving signal DR2 for the light-shielding display panel 108 for displaying.

The timing controller 104 may be independent from the video source 102. Alternatively, the timing controller 104 may be implemented in the video source 102. In such case, the video source 102 may realize the function of the timing controller 104 and directly convert the display data IN into the first driving signal DR1 and the second driving signal DR2 required for the transparent display panel 106 and the light-shielding display panel 108.

Figure 2:
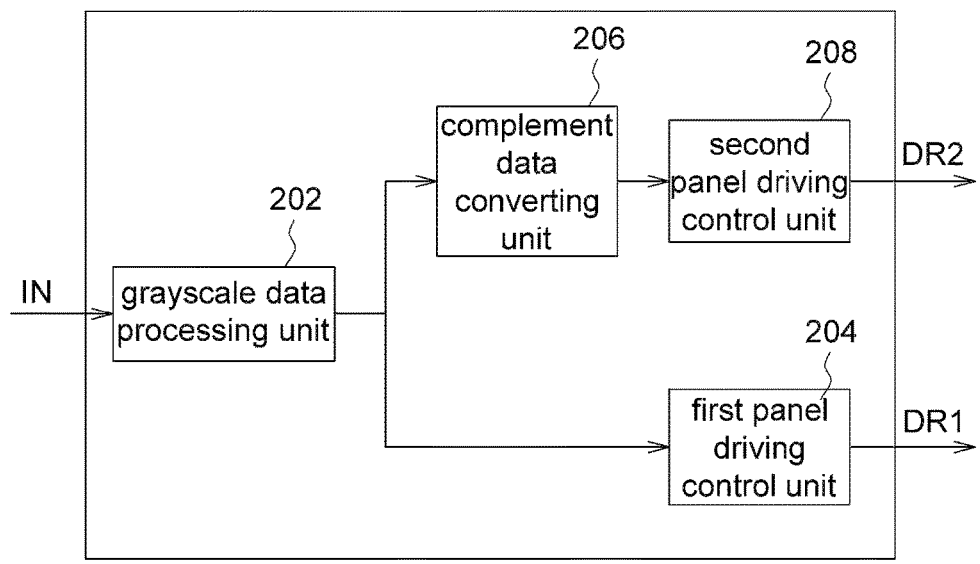
FIG. 2 shows a block diagram of a timing controller according to an embodiment of the present disclosure.

FIG. 2 shows a block diagram of the timing controller 104 according to an embodiment of the present disclosure. The timing controller 104 includes a grayscale data processing unit 202, a first panel driving control unit 204, a complement data converting unit 206, and a second panel driving control unit 208. The timing controller 104 may be implemented as an electronic device including a memory and a processor. The various units of the timing controller 104 may be implemented as software components (e.g., programs, instructions, files and data), hardware components (e.g., logic circuits) or a combination thereof in the processor. The processor may control the operations of the various units to implement the method for driving the dual-media display panel according to the embodiments of the present disclosure.

The grayscale data processing unit 202 may receive the display data IN from the video source 102 and obtain a display-unit grayscale value according to the display data IN. The display data IN may be pixel data including a plurality of sub-pixel grayscale values. For example, if the video source 102 provides a RGB image to the timing controller 104, the sub-pixel grayscale values may include a red sub-pixel grayscale value (hereinafter referred to as R value), a green sub-pixel grayscale value (hereinafter referred to as G value) and a blue sub-pixel grayscale value (hereinafter referred to as B value).

In an example, the grayscale data processing unit 202 may average the sub-pixel grayscale values of the pixel data, and use the weighted average result as the display-unit grayscale value for the display data IN. In another example, the display-unit grayscale value for the display data IN is represented by one of the sub-pixel grayscale values of the pixel data, such as one of the R, G and B values.

The display-unit grayscale value may be provided to the complement data converting unit 206 for classification. The second panel driving control unit 208 may generate the second driving signal DR2 according to the classification result, so as to drive a display unit of the light-shielding display panel 108 to display a certain grayscale, such as black, gray or white. Each display unit may refer to one pixel or one sub-pixel (e.g., red/green/blue sub-pixel) in one pixel of the light-shielding display panel 108.

The grayscale data processing unit 202 may also provide the display data IN to the first panel driving control unit 204. The first panel driving control unit 204 may generate the first driving signal DR1 in response to the display data IN, so as to drive the transparent display panel 106 to display a corresponding color.

According to the embodiments of the present disclosure, the complement data converting unit 206 may determine whether the display-unit grayscale value falls within a grayscale value interval, wherein the grayscale value interval is included in a maximum grayscale range. The maximum grayscale range is determined by the resolution of image grayscale. Taking 8-bit resolution as an example, the maximum grayscale range is from 0 to 255. The grayscale value interval is a sub-range of the maximum grayscale range, which is between an upper limit (H) and a lower limit (L).

When the complement data converting unit 206 determines that the display-unit grayscale value falls within the grayscale value interval, the second panel driving control unit 208 calculates the complement grayscale value of the display-unit grayscale value and generates the second driving signal DR2 according to the complement grayscale value. In an example, the second panel driving control unit 208 calculates the complement grayscale value by subtracting the display-unit grayscale value from the maximum grayscale value of the maximum grayscale range. For example, if the maximum grayscale range is from 0 to 255 and the display-unit grayscale value is 147, the complement grayscale value is 255−147=108.

The second driving signal DR2 may be arranged to have a specific amplitude and/or pulse width to enable a corresponding display unit on the light-shielding display panel 108 to present the complement grayscale (e.g., grayscale value=108).

If the complement data converting unit 206 determines that the display-unit grayscale value is less than the lower limit (L), the second panel driving control unit 208 may use a driving signal adapted to enabling the light-shielding display panel 108 to display a black color as the second driving signal DR2. On the contrary, if the complement data converting unit 206 determines that the display-unit grayscale value is greater than the upper limit (H), the second panel driving control unit 208 may use a driving signal adapted to enabling the light-shielding display panel 108 to display a white color as the second driving signal DR2.

Through the above mechanism, the first driving signal DR1 and the second driving signal DR2 respectively required for the transparent display panel 106 and the light-shielding display panel 108 are generated by the timing controller 104 in response to a single display data IN without setting up dedicated timing controllers for each display panel. Furthermore, if the display data IN is corresponding to the black or near black image content, the display data IN may enable the complement data converting unit 206 and the second panel driving control unit 208 to generate a second driving signal DR2 which is adapted to driving the light-shielding display panel 108 to display the black color, so that the problem of failing to use some types of transparent display panels to display the black color can be solved.

Below, various embodiments of the method for driving the dual-media display panel are described with reference to FIGS. 3A, 3B, 4A, 4B, 5A, 5B, 6A, 6B, 7 and 8. It should be noted that these embodiments are not exhaustive or limiting. In some applications, combinations and modifications of one or more of the embodiments are permissible.

First Embodiment

Figure 3A:
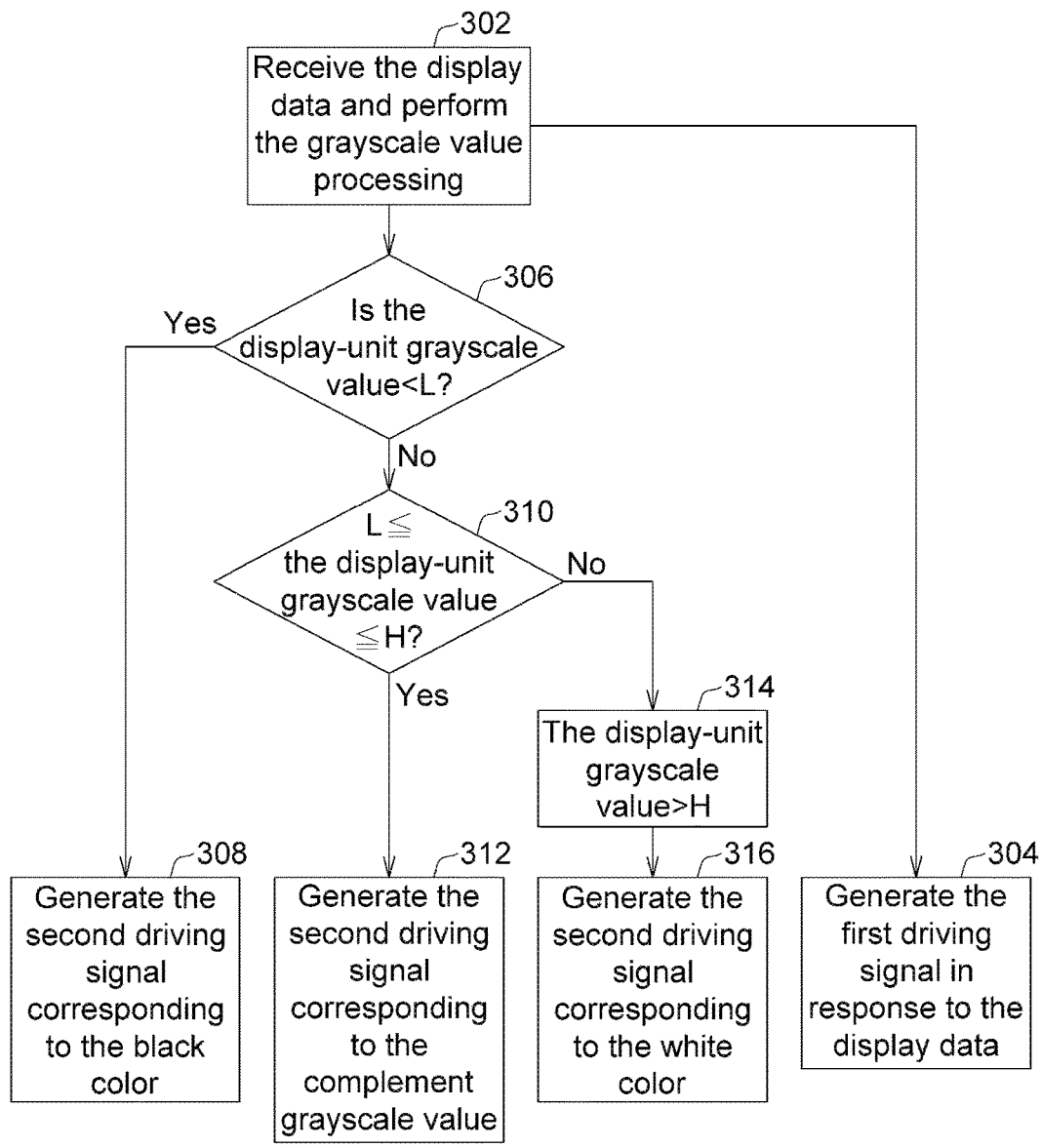
FIG. 3A illustrates a flowchart of a method for driving a dual-media display panel according to the first embodiment of the present disclosure.

FIG. 3A illustrates a flowchart of a method for driving a dual-media display panel according to the first embodiment of the present disclosure. The method for driving the dual-media display panel can be implemented by the timing controller 104 in FIG. 1, for example.

In this embodiment, each display unit in the light-shielding display panel 108 is a sub-pixel. Therefore, if the display data IN is pixel data including a plurality of sub-pixel grayscale values (e.g., R, G, B values), the grayscale of the display unit (i.e., display-unit grayscale value) may be represented by one of the sub-pixel grayscale values.

At step 302, the grayscale data processing unit 202 receives the display data IN and performs grayscale value processing. The grayscale value processing may include transmitting the sub-pixel grayscale values of the display data IN to the first panel driving control unit 204 and the complement data converting unit 206. In this embodiment, each display-unit grayscale value is represented by one sub-pixel grayscale value such as the R, G or B value.

In step 304, the first panel driving control unit 204 generates the first driving signal DR1 in response to the display data IN. Step 304 may be implemented by any known transparent display panel driving method. For example, the first panel driving control unit 204 may generate a set of first driving signals DR1 to be applied to the red, green and blue sub-pixels in the transparent display panel 106 according to the R, G and B values of the display data IN, respectively, so as to enable the transparent display panel 106 to display the pixel content corresponding to the display data IN.

In step 306, the complement data converting unit 206 determines whether the display-unit grayscale value is less than the lower limit (L) of the grayscale value interval. If yes, it indicates that the display-unit grayscale value is close to or corresponding to the black color. In such case (in step 308), the second panel driving control unit 208 uses a driving signal adapted to driving the light-shielding display panel 108 to display the black color as the second driving signal DR2. For example, if the light-shielding display panel 108 is an EC display panel, the second panel driving control unit 208 may generate the second driving signal DR2 according to the maximum pixel value (e.g., 255), so as to enable the corresponding display unit (i.e., the sub-pixel) in the light-shielding display panel 108 to display the black color.

If the determination in step 306 is negative, then in step 310, the complement data converting unit 206 further determines whether the display-unit grayscale value falls within the grayscale value interval. If the determination is yes, in step 312, the second panel driving control unit 208 calculates the complement grayscale value of the display-unit grayscale value and generates the second driving signal DR2 according to the calculated complement grayscale value. For example, if the maximum grayscale range is from 0 to 255 and the display-unit grayscale value R=10, the corresponding complement grayscale value of the display-unit grayscale value is 255−10=245. In such case, the second panel driving control unit 208 applies a second driving signal DR2 representing a grayscale value of 245 to the display unit (e.g., a red sub-pixel) in the light-shielding display panel 108. In an example, the second panel driving control unit 208 may configure the second driving signal DR2 based on the following equation, so as to enable the display unit (a pixel or a sub-pixel) in the light-shielding display panel 108 to present the desired grayscale value PV:

$$PV(P_{max} - P_u) \frac{K}{P_{max}+1} \qquad \text{(equation 1)}$$

Wherein $P_{max}$ is the maximum grayscale value of the maximum grayscale range, $P_u$ is the display-unit grayscale value, and K is a positive integer from 1 to $P_{max}+1$. The magnitude of the K value may be determined by the displayable grayscale range of the light-shielding display panel 108.

If the determination in step 310 is no, as shown in step 314, the display-unit grayscale value is greater than the upper limit (H) of the grayscale value interval, which means that the display-unit grayscale value may be corresponding to or close to the white color. In step 316, the second panel driving control unit 208 outputs a second drive signal DR2 adapted to driving the display unit in the light-shielding display panel 108 to display the white color. For example, if the light-shielding display panel 108 is an EC display panel, the second panel driving control unit 208 may generate the second driving signal DR2 according to a minimum pixel value (e.g., 0), so that the corresponding display unit in the light-shielding display panel 108 displays the white color.

Figure 3B:
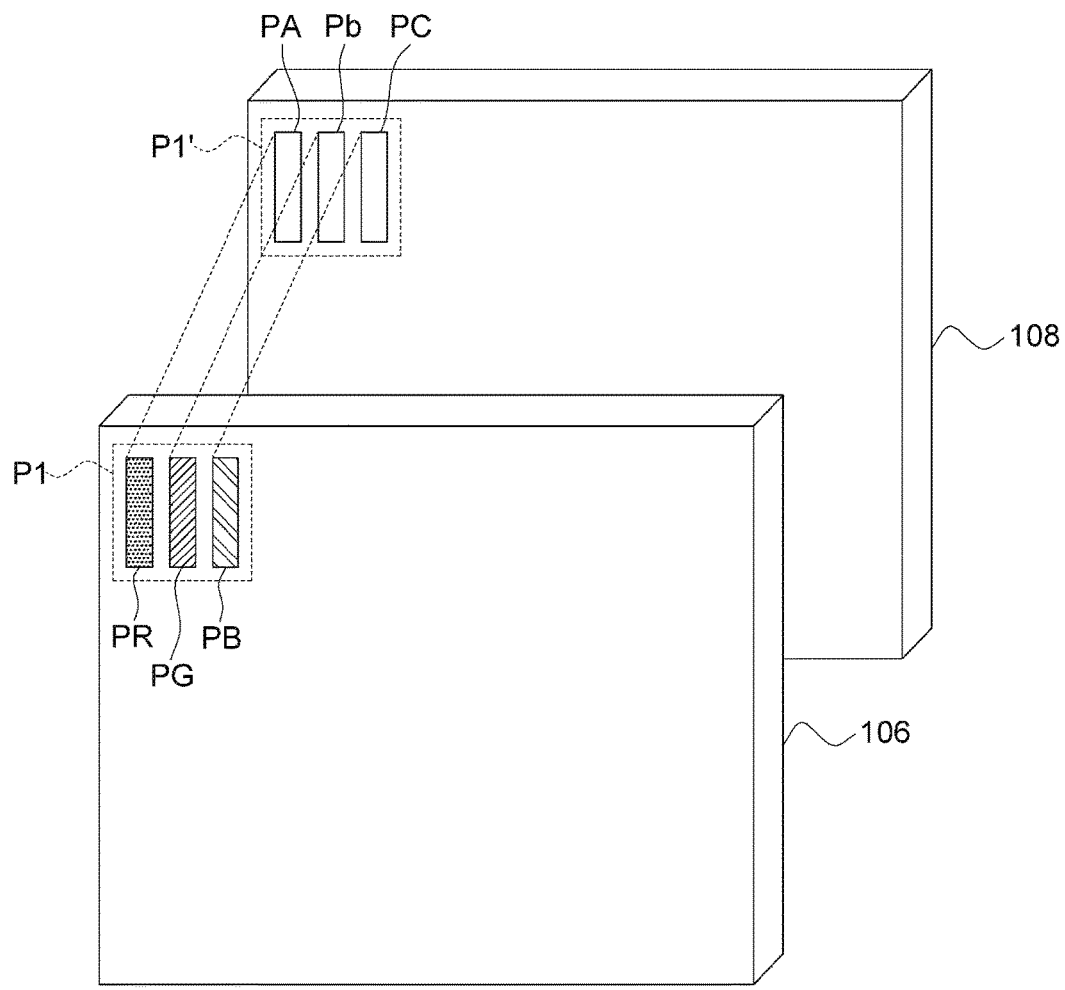
FIG. 3B shows a partial schematic view of a dual-media display panel driven by the method of FIG. 3A.

Referring to FIG. 3B, a partial schematic view of a dual-media display panel driven by the method of FIG. 3A is shown. As shown in FIG. 3B, the transparent display panel 106 and the light-shielding display panel 108 include pixels P1 and P1', respectively. The transparent display panel 106 and the light-shielding display panel 108 are stacked together and forms a dual-media display panel, wherein the pixels P1 and P1' and the sub-pixels therein have the same pixel position.

In the example of FIG. 3B, it is assumed that the R, G and B values of the display data IN are 10, 147 and 237, respectively. The first panel driving control unit 204 may generate a set of first driving signals DR1 according to the R value (=10), the G value (=147) and the B value (=237), so as to drive the red sub-pixel PR, the green sub-pixel PG and the blue sub-pixel PB in the pixel P1 of the transparent display panel 106, respectively.

The pixel P1' in the light-shielding display panel 108 includes sub-pixels PA, Pb and PC, wherein the pixel positions of the sub-pixel PA, the sub-pixel Pb and sub-pixel PC are corresponding to the pixel positions of the red sub-pixel PR, the green sub-pixel PG and the blue sub-pixel PB, respectively.

In this example, each of the sub-pixels PA, Pb and PC is considered as a display unit in the light-shielding display panel 108 (i.e., each sub-pixel in the display panel is taken as a basic unit for driving). Given that the lower limit L=16 and the upper limit H=235, as for the pixel P1', because the R value of the display data IN is equal to 10, which is less than the lower limit L=16, the second panel driving control unit 208 may generate a second driving signal DR2 that is adapted to enabling the sub-pixel PA to display the black color. As for the sub-pixel Pb, because the G value of the display data IN is equal to 147, which falls within the grayscale value interval, the second panel driving control unit 208 may generate a second driving signal DR2 according to the complement grayscale value of the G value (i.e., 255−147=108), so as to enable the sub-pixel Pb to display a gray color with a grayscale value of 108

$$\left(\text{or } 108 \times \frac{K}{256}\right).$$

As for the sub-pixel PC, because the B value of the display data IN is equal to 237, which is greater than the upper limit H=235, the second panel driving control unit 208 may generate a second driving signal DR2 adapted to enabling the sub-pixel PC to display the white color.

Second Embodiment

Figure 4A:
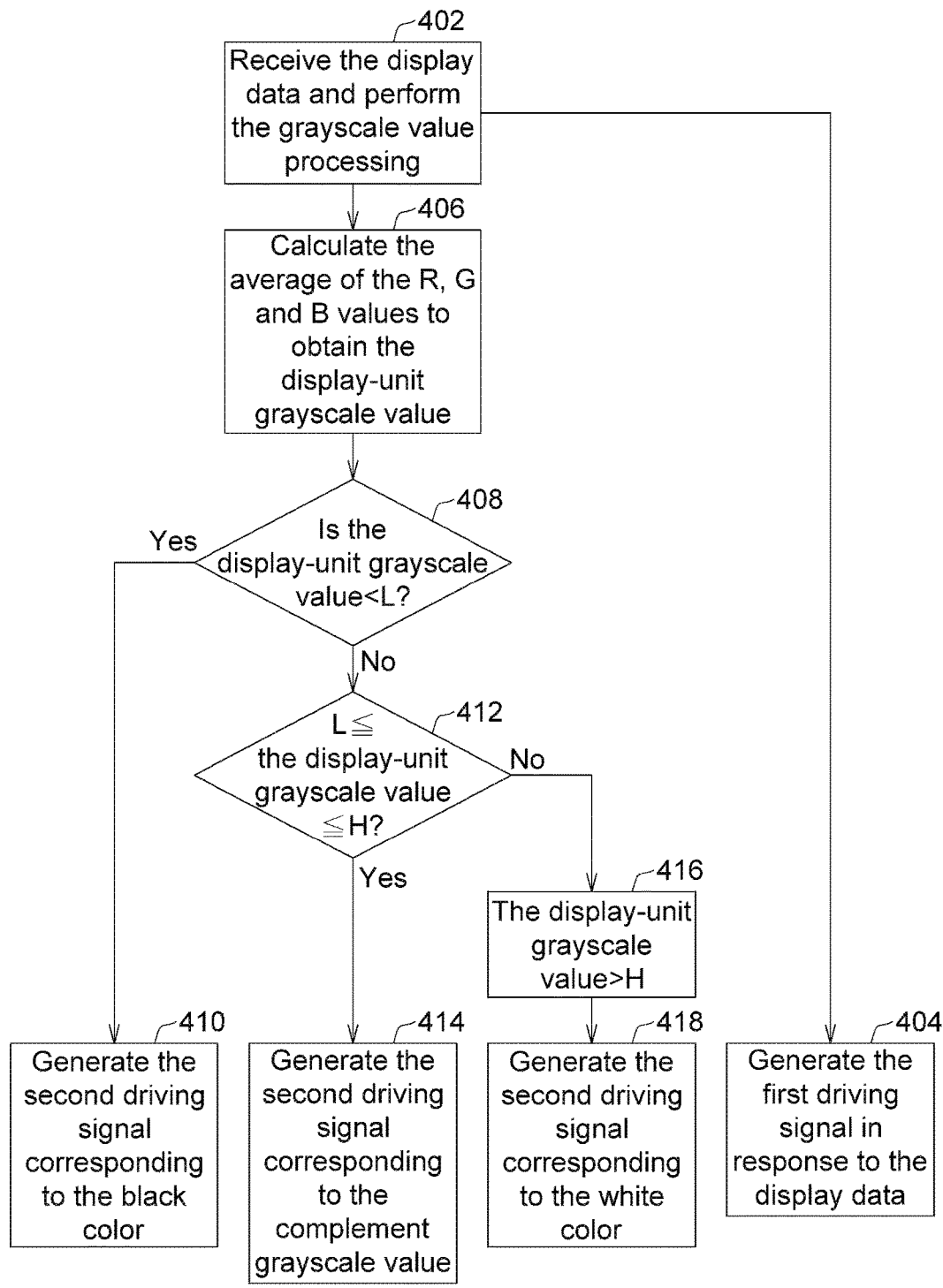
FIG. 4A illustrates a flowchart of a method for driving a dual-media display panel according to the second embodiment of the present disclosure.

FIG. 4A illustrates a flowchart of a method for driving a dual-media display panel according to the second embodiment of the present disclosure. The method for driving the dual-media display panel may be implemented by the timing controller 104 in FIG. 1, for example. The main difference between this embodiment and the first embodiment is that in this embodiment, each display unit in the light-shielding display panel 108 is represented by a pixel rather than a sub-pixel. Therefore, if the display data IN is pixel data including a plurality of sub-pixel grayscale values, the grayscale value of the display unit (i.e., the display-unit grayscale value) may be represented as a weighted average of the sub-pixel grayscale values, for example.

As shown in FIG. 4A, in step 402, the grayscale data processing unit 202 receives the display data IN and performs the grayscale value processing which includes transmitting the sub-pixel grayscale values of the display data IN to the first panel driving control unit 204.

In step 404, the first panel driving control unit 204 generates the first driving signal DR1 in response to the display data IN. Similar to step 304 in FIG. 3A, step 404 may be implemented by any known transparent display panel driving method.

In step 406, the grayscale data processing unit 202 calculates a weighted average of the sub-pixel grayscale values of the pixel data as the display-unit grayscale value. For example, the grayscale data processing unit 202 may calculate a weighted average of the R, G and B values of the display data IN, and use the calculated weighted average as the display-unit grayscale value.

In step 408, the complement data converting unit 206 determines whether the display-unit grayscale value is less than the lower limit (L) of the grayscale value interval. If the determination is yes, in step 410, the second panel driving control unit 208 uses a driving signal adapted to driving the light-shielding display panel 108 to display the black color as the second driving signal DR2.

If the determination in step 408 is negative, in step 412, the complement data converting unit 206 further determines whether the display-unit grayscale value falls within the grayscale value interval. If the determination is yes, in step 414, the second panel driving control unit 208 calculates the complement grayscale value of the display-unit grayscale value and generates the second driving signal DR2 according to the calculated complement grayscale value. The implementation of step 414 is the same as that of step 312 in FIG. 3A, so it is not repeated here.

If the determination in step 412 is no, in step 416, the display-unit grayscale value is greater than the upper limit (H) of the grayscale value interval. In step 418, the second panel driving control unit 208 outputs a second drive signal DR2 adapted to driving the display unit in the light-shielding display panel 108 to display the white color.

Figure 4B:
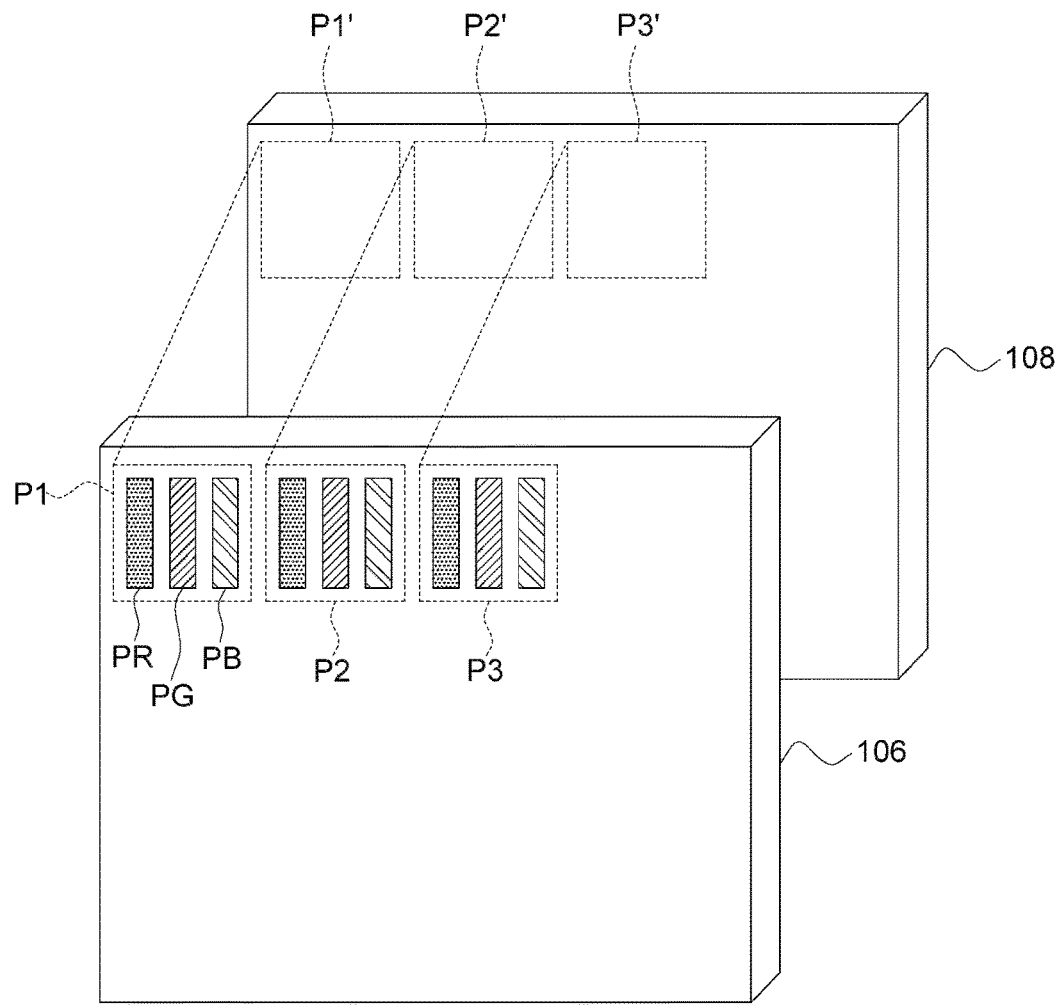
FIG. 4B illustrates a partial schematic view of a dual-media display panel driven by the method of FIG. 4A.

FIG. 4B illustrates a partial schematic view of a dual-media display panel driven by the method of FIG. 4A. As shown in FIG. 4B, the transparent display panel 106 includes pixels P1, P2 and P3 and the light-shielding display panel 108 includes pixels P1', P2' and P3'. The transparent display panel 106 and the light-shielding display panel 108 are stacked together and forms a dual-media display panel, wherein the pixels P1 and P1' have the same pixel position, the pixels P2 and P2' have the same pixel position, and the pixels P3 and P3' have the same pixel position.

In the example of FIG. 4B, it is assumed that the display data IN for the pixels P1 and P1' includes R value=10, G value=17 and B value=16; the display data IN for the pixels P2 and P2' includes R value=12, G value=232 and B value=199; and the display data IN for the pixels P3 and P3' includes R value=255, G value=241 and B value=215. The first panel driving control unit 204 may generate a set of first driving signals DR1 for driving the red sub-pixel PR, the green sub-pixel PG and the blue sub-pixel PB in each of the pixels P1, P2 and P3 according to the display data IN.

In this example, each of the pixels P1', P2' and P3' is considered as a display unit in the light-shielding display panel 108 (i.e., each pixel in the display panel is taken as a basic unit for driving). Given that the lower limit L=16 and the upper limit H=235, as for the pixel P1', because the average (i.e., the display-unit grayscale value) of the R, G and B values of the display data IN is equal to (10+17+16)/3=10, which is less than the lower limit L=16, the second panel driving control unit 208 may generate a second driving signal DR2 adapted to enabling the pixel P1' to display the black color. As for the pixel P2', because the average (i.e., the display-unit grayscale value) of the R, G and B values of the display data IN is equal to (12+232+199)/3≈147, which falls within the grayscale value interval, the second panel driving control unit 208 may generate a second driving signal DR2 according to the complement grayscale value of the display-unit grayscale value (i.e., 255−147=108), so as to enable the pixel P2' to display a gray color with a gray value of 108

$$\left(\text{or } 108 \times \frac{K}{256}\right).$$

As for the pixel P3', because the average (i.e., the display-unit grayscale value) of the R, G and B values of the display data IN is equal to (255+241+215)/3=237, which is greater than the upper limit H=235, the second panel driving control unit 208 may generate a second driving signal DR2 adapted to enabling the sub-pixel P3' to display the white color.

Third Embodiment

Figure 5A:
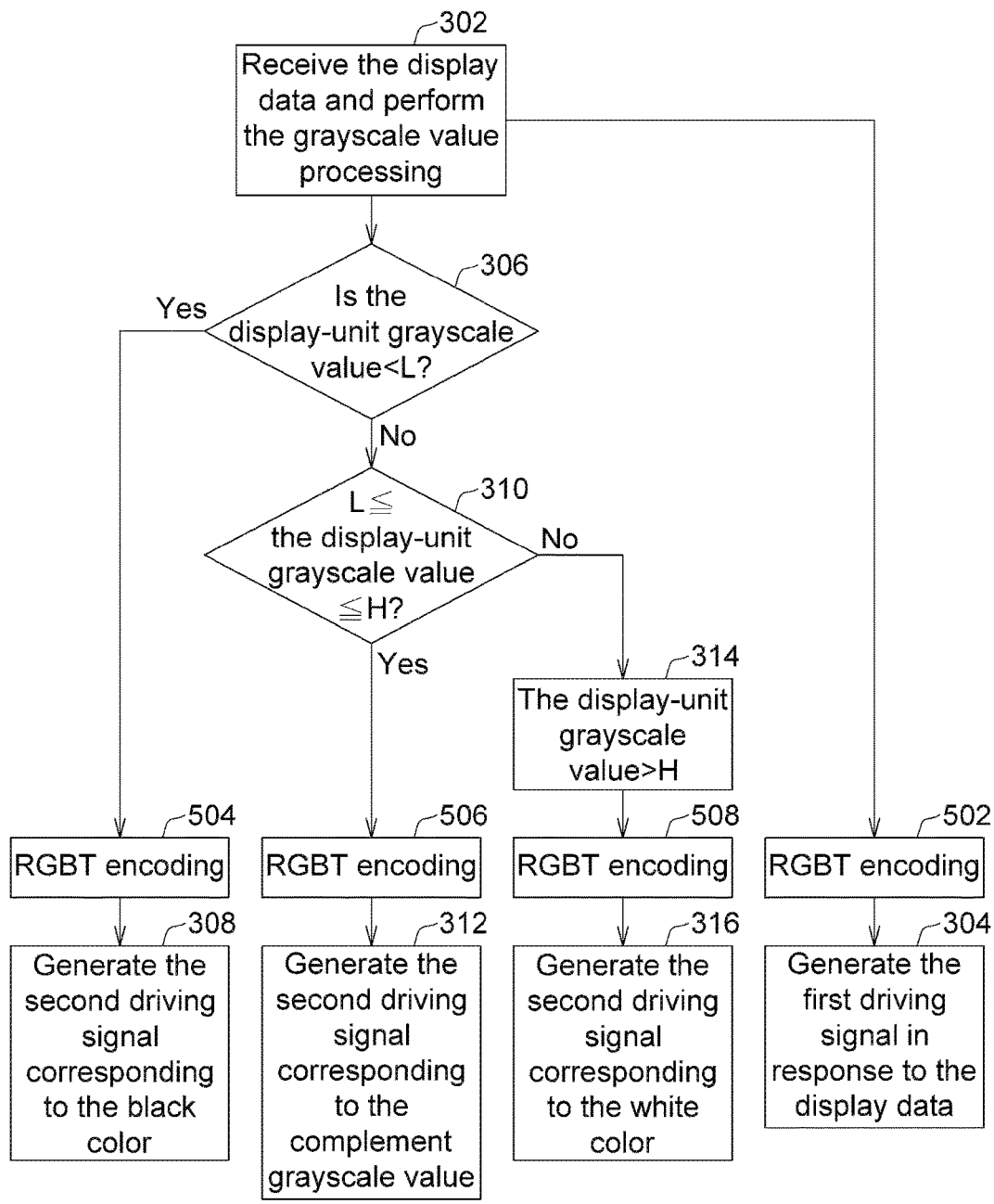
FIG. 5A illustrates a flowchart of a method for driving a dual-media display panel according to the third embodiment of the present disclosure.

FIG. 5A illustrates a flowchart of a method for driving a dual-media display panel according to the third embodiment of the present disclosure. The method for driving the dual-media display panel may be implemented by the timing controller 104 in FIG. 1, for example. The main difference between this embodiment and the first embodiment is that in this embodiment, each pixel has an RGBT (or called RGBW) structure. That is, in addition to the red sub-pixel PR, the green sub-pixel PG, and the blue sub-pixel PB, each pixel further includes a white sub-pixel PT. For the transparent display panel 106, the white sub-pixel is mainly responsible for the adjustment of the transparency/transmittance of the pixel.

The grayscale value of the white sub-pixel may be determined by any known RGBT pixel driving method. For example, the grayscale value of the white sub-pixel may be selected from the largest of the R, G and B values of the pixel data. In another example, the grayscale value of the white sub-pixel may be represented by the weighted average of the R, G and B values. The abovementioned RGBT encoding procedure for determining the grayscale value of the white sub-pixel may be implemented in steps 502, 504, 506, and 508 of FIG. 5A, for example.

Figure 5B:
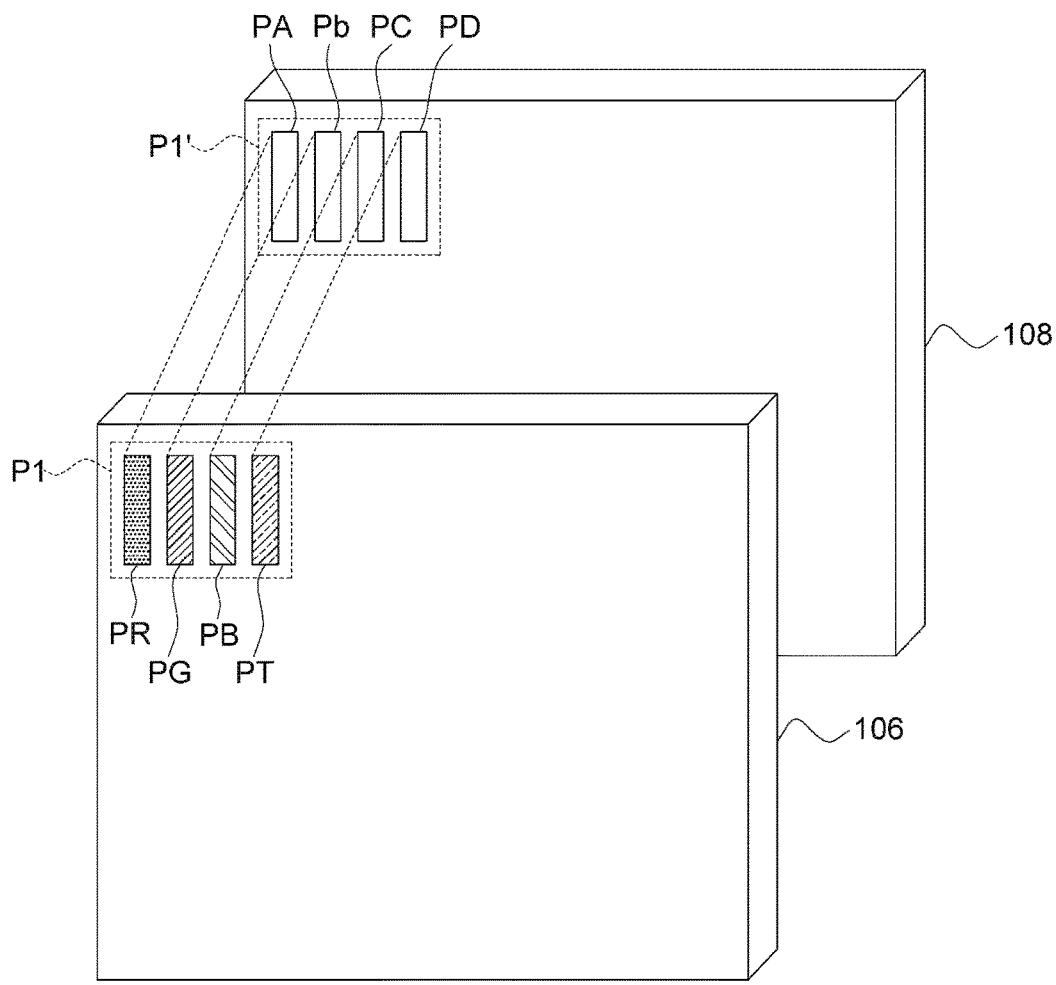
FIG. 5B illustrates a partial schematic view of a dual-media display panel driven by the method of FIG. 5A.

FIG. 5B illustrates a partial schematic view of a dual-media display panel driven by the method of FIG. 5A. The main difference between this figure and FIG. 3B is that the pixel P1 of the transparent display panel 106 further includes a white sub-pixel PT, and the pixel P1' of the light-shielding display panel 108 further includes a sub-pixel PD, wherein the white sub-pixel PT and the sub-pixel PD have the same pixel position.

Fourth Embodiment

Figure 6A:
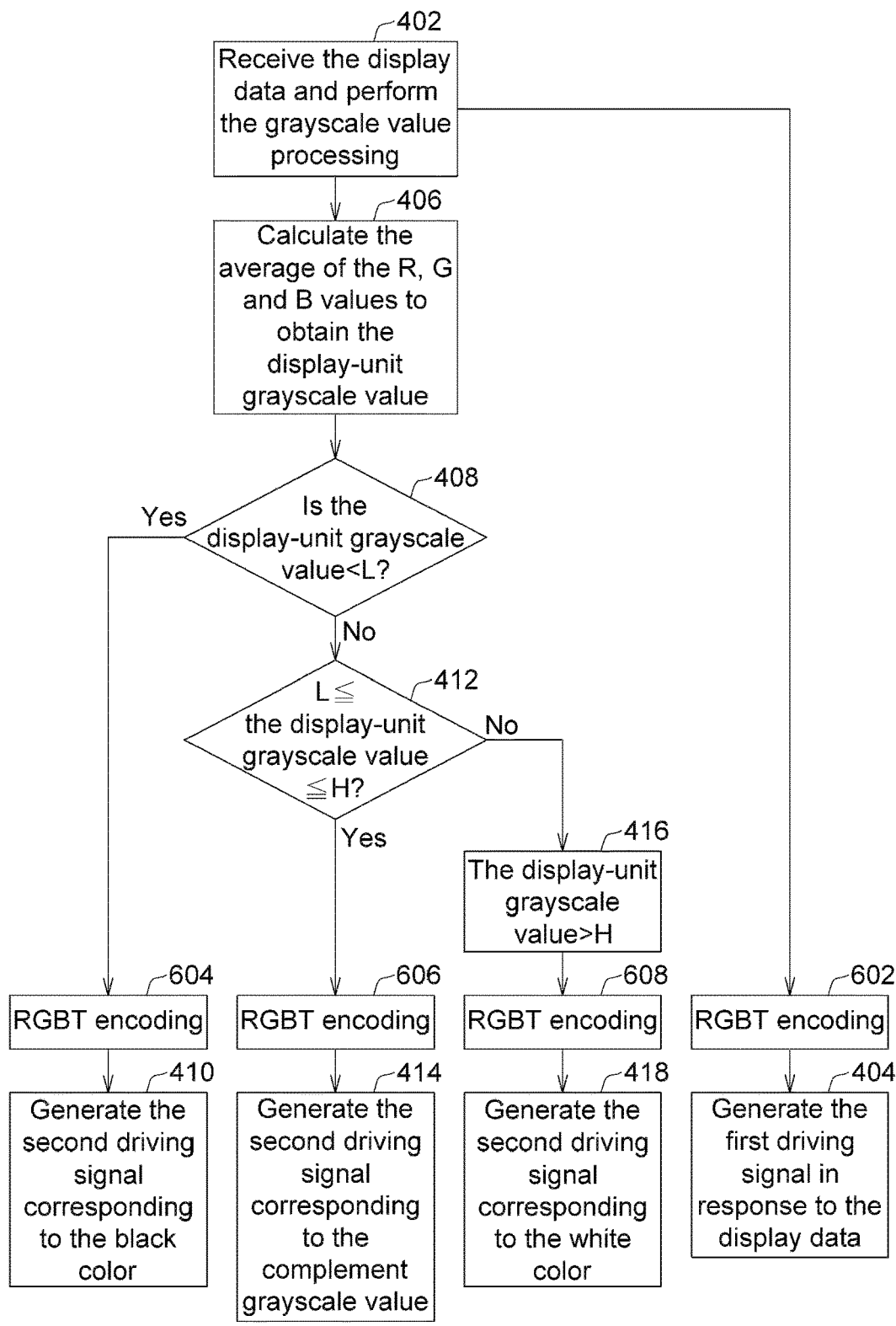
FIG. 6A illustrates a flowchart of a method for driving a dual-media display panel according to the fourth embodiment of the present disclosure.

FIG. 6A illustrates a flowchart of a method for driving a dual-media display panel according to the fourth embodiment of the present disclosure. The method for driving the dual-media display panel may be implemented by, for example, the timing controller 104 in FIG. 1. The main difference between this embodiment and the second embodiment is that in this embodiment, each pixel has an RGBT structure. That is, in addition to the red sub-pixel PR, the green sub-pixel PG, and the blue sub-pixel PB, each pixel further includes a white sub-pixel PT.

The grayscale value of the white sub-pixel may be determined by any known RGBT pixel driving method. As mentioned above, the grayscale value of the white sub-pixel may be selected from the largest of the R, G and B values of the pixel data. In another example, the grayscale value of the white sub-pixel may be represented by the average of the R, G and B values. The abovementioned RGBT encoding procedure for determining the grayscale value of the white sub-pixel may be implemented in steps 602, 604, 606, and 608 of FIG. 6A, for example.

Figure 6B:
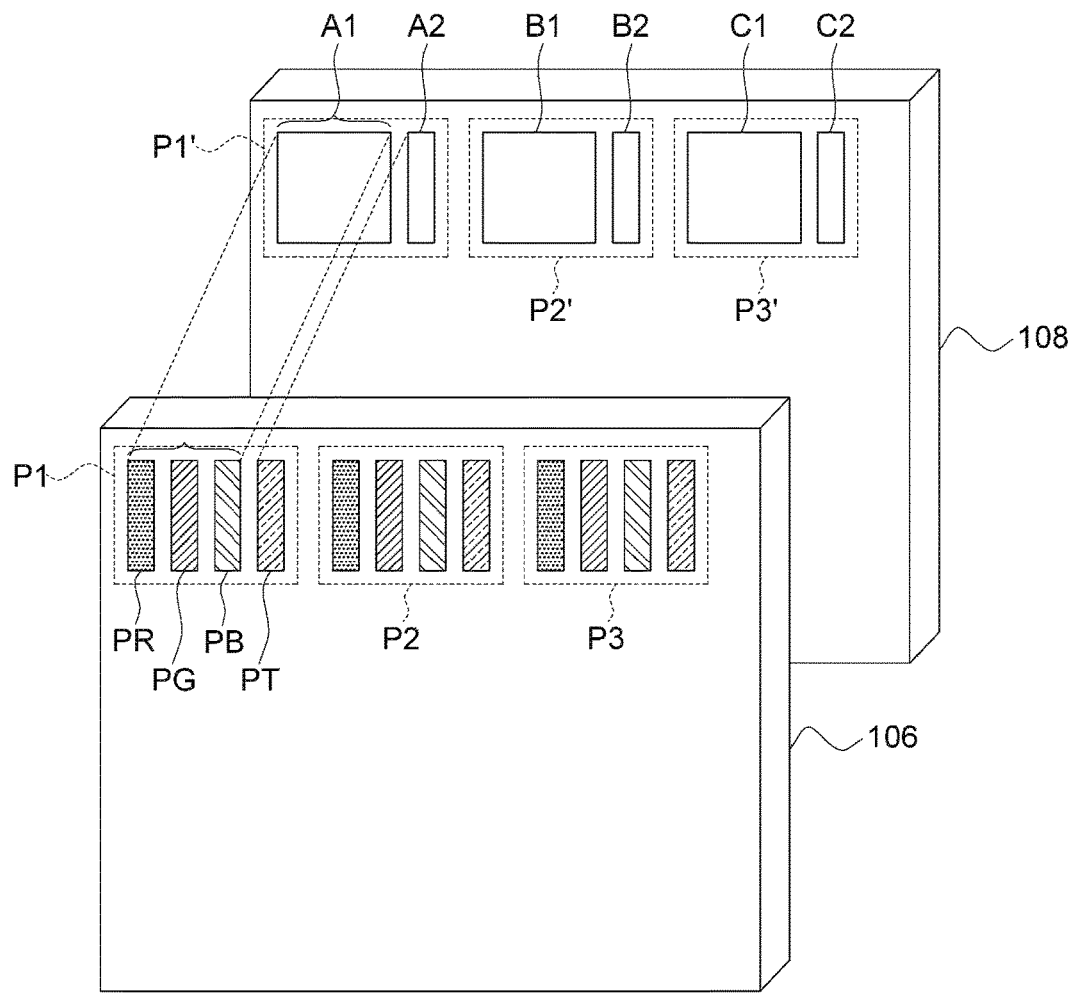
FIG. 6B illustrates a partial schematic view of a dual-media display panel driven by the method of FIG. 6A.

FIG. 6B illustrates a partial schematic view of a dual-media display panel driven by the method of FIG. 6A. The main difference between this figure and FIG. 4B is that each of the pixels P1, P2 and P3 of the transparent display panel 106 further includes a white sub-pixel PT. The pixel P1' of the light-shielded display panel 108 includes sub-pixel regions A1 and A2. The pixel P2' includes sub-pixel regions B1 and B2. The pixel P3' includes sub-pixel regions C1 and C2. The sub-pixel regions A1, B1 and C1 are respectively corresponding to the red, green and blue sub-pixels PR, PG and PB of the pixels P1, P2 and P3 in the transparent display panel 106. The sub-pixel regions A2, B2 and C2 are corresponding to the white sub-pixels PT of the pixels P1, P2, and P3 in the transparent display panel 106, respectively.

Fifth Embodiment

Figure 7:
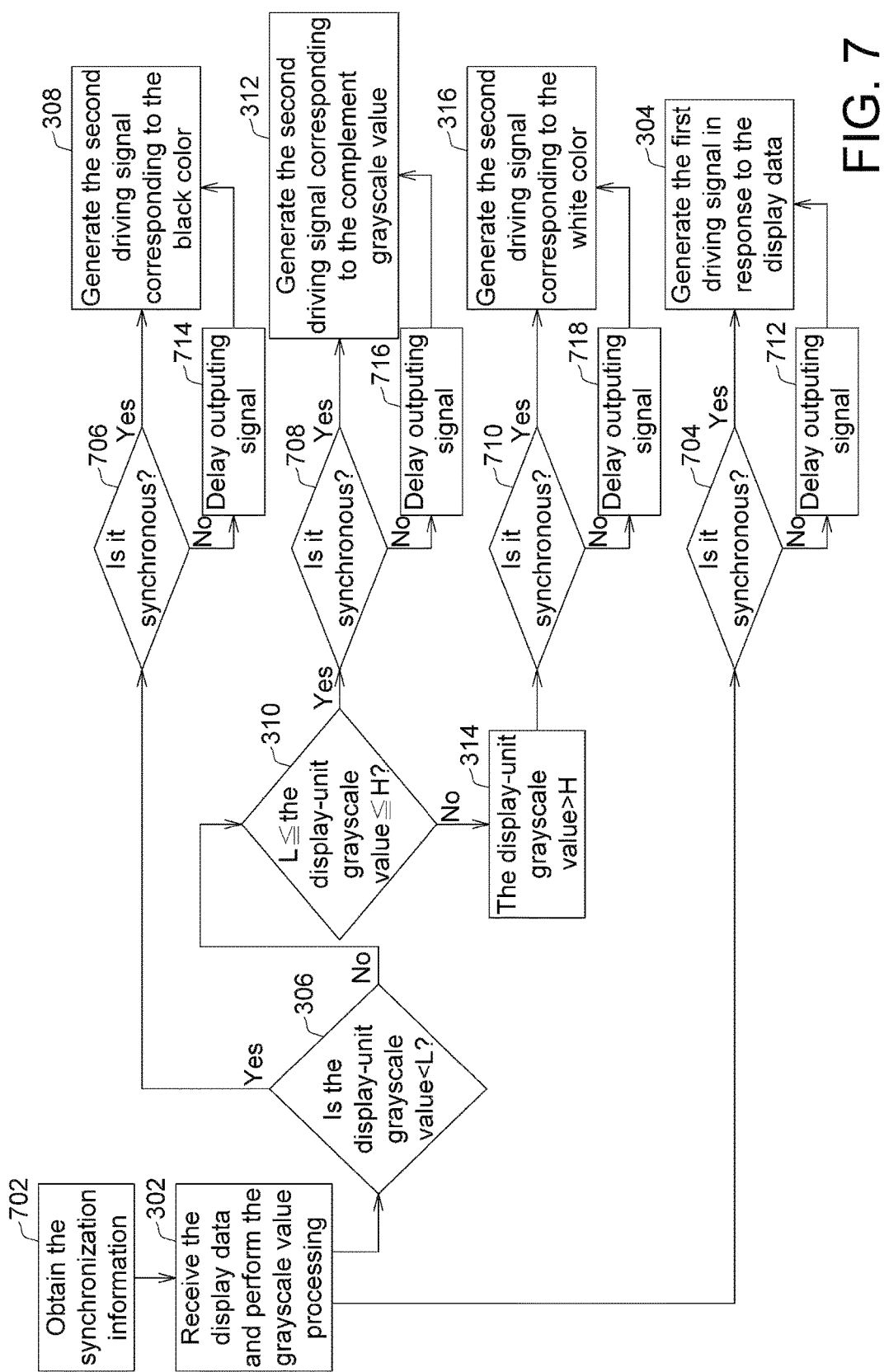
FIG. 7 illustrates a flowchart of a method for driving a dual-media display panel according to the fifth embodiment of the present disclosure.

FIG. 7 illustrates a flowchart of a method for driving a dual-media display panel according to the fifth embodiment of the present disclosure. The method for driving the dual-media display panel may be implemented by, for example, the timing controller 104 in FIG. 1. The main difference between this embodiment and the foregoing embodiments is that in this embodiment, the timing controller 104 obtains synchronization information that describes a time difference between the signal transmission time for the transparent display panel 106 and the signal transmission time for the light-shielding display panel 108. For example, the synchronization information can be acquired from the video source 102. The video source 102 may calculate or set the time difference between the signal transmissions of different types of display panels based on existing dual-media display panel synchronization technology and generate the synchronization information accordingly.

According to the synchronization information, the timing controller 104 may delay outputting the first driving signal DR1 or the second driving signal DR2 to compensate the time difference and synchronously output the first driving signal DR1 and the second driving signal DR2. For example, if the timing controller 104 learns that, according to the synchronization information, the signal transmission time for the transparent display panel 106 is shorter than the signal transmission time to the light-shielded display panel 108, the timing controller 104 may delay outputting the first driving signal DR1 to the transparent display panel 106, so that the first driving signal DR1 and the second driving signal DR2 are output to the dual-media display panel at approximately the same time for displaying.

As shown in FIG. 7, compared with the flowchart of FIG. 3A, this embodiment further includes steps 702, 704, 706, 708, 710, 712, 714, 716 and 718.

In step 702, the timing controller 104 obtains the synchronization information from the video source 102. In step 704, the first panel driving control unit 204 determines whether the signal transmissions are synchronized. If the signal transmissions are not synchronized and the timing controller 104 learns that the signal transmission time for the transparent display panel 106 is shorter than that for the light-shielding display panel 108 according to the synchronization information, then in step 712, the first panel driving control unit 204 delays outputting signal through a data buffer to delay the first driving signal DR1.

Similarly, in steps 706, 708, and 710, the second panel driving control unit 208 may determine whether the signal transmissions are synchronized. If the signal transmissions are not synchronized and the timing controller 104 learns that, according to the synchronization information, the signal transmission time for the light-shielding display panel 108 is shorter than the signal transmission time for the transparent display panel 106, the signal outputs are delayed in steps 714, 716 and 718, respectively, so as to delay the second driving signal DR2.

Sixth Embodiment

Figure 8:
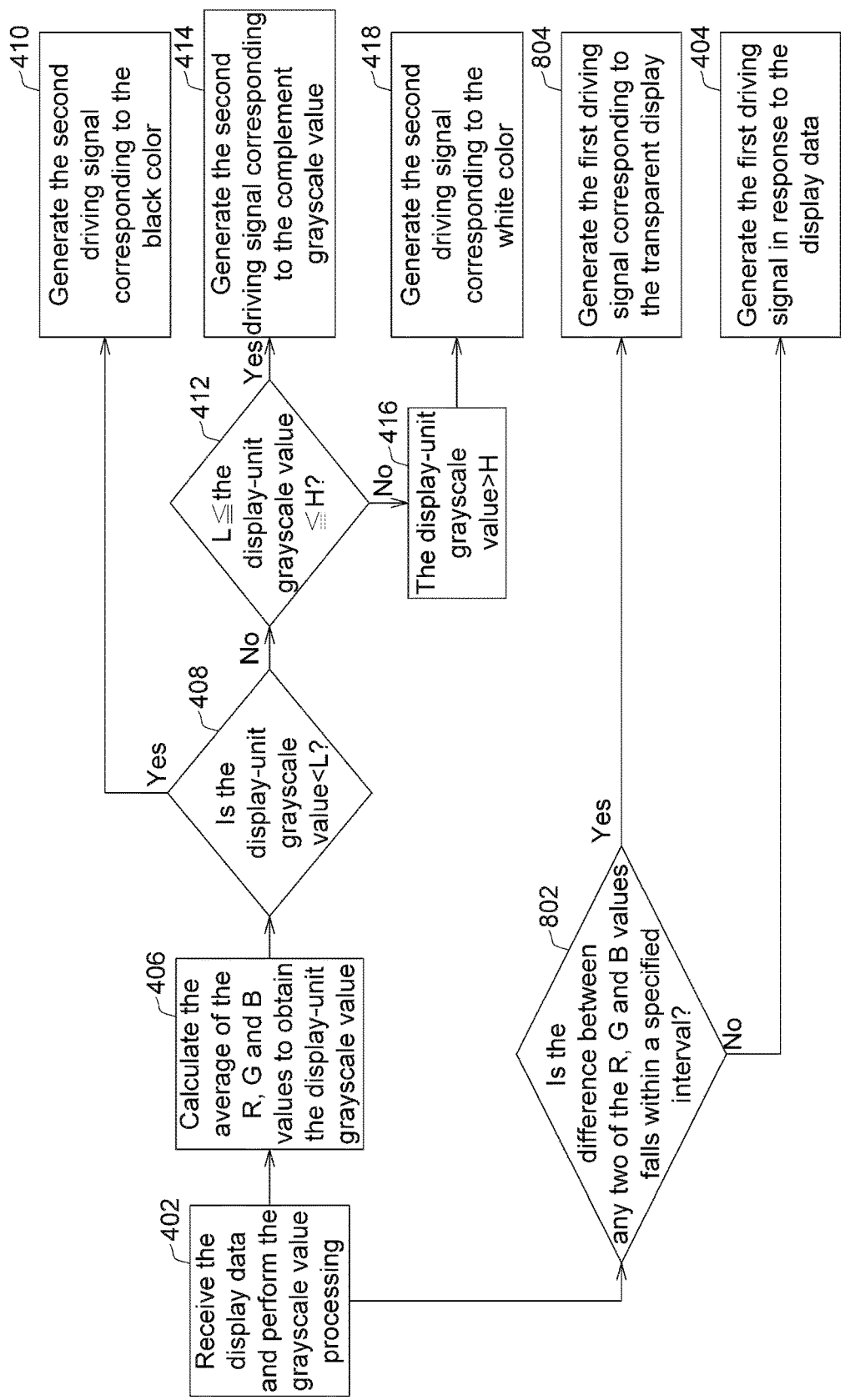
FIG. 8 illustrates a flowchart of a method for driving a dual-media display panel according to the sixth embodiment of the present disclosure.

FIG. 8 illustrates a flowchart of a method for driving a dual-media display panel according to the sixth embodiment of the present disclosure. The method for driving the dual-media display panel may be implemented by, for example, the timing controller 104 in FIG. 1. The main difference between this embodiment and the foregoing embodiments is that in this embodiment, the timing controller 104 determines whether a difference between any two of the sub-pixel grayscale values in the display data IN falls within a specified interval. If yes, the timing controller 104 may use a driving signal adapted to enabling the transparent display panel 106 to appear transparent and colorless as the first driving signal DR1. If not, the timing controller 104 generates the first driving signal DR1 according to the sub-pixel grayscale values. This is because when the difference between any two of the sub-pixel grayscale values in the display data IN is small (e.g., R value=G value=B value) and falls within the specified interval, the color to be presented may be a grayscale color, such as black, gray or white. In such case, the grayscale color can be displayed only by the light-shielded display panel 108, and the transparent display panel 106 only needs to maintain transparent, thereby reducing the power consumption of the display panel.

As shown in FIG. 8, compared with the flowchart of FIG. 4A, this embodiment further includes steps 802 and 804.

In step 802, the grayscale data processing unit 202 determines whether the difference between any two of the R, G and B values in the display data IN falls within the specified interval. If yes, in step 804, the first panel driving control unit 204 generates the first driving signal DR1 according to a pixel value (e.g., 0) that can make the transparent display panel 106 appear transparent and colorless.

It can be understood that, in this embodiment, the flow (including steps 402, 406, 408, 410, 412, 414, 416 and 418) for generating the second driving signal DR2 in response to the display data IN can also be implemented as the flow including steps 302, 306, 308, 310, 312, 314 and 316 of FIG. 3A.

According to above, the embodiments of the present disclosure provide a method for driving a dual-media display panel, and an electronic device and a display system using the same. According to the embodiments of the present disclosure, the timing controller generates a first driving signal required for the transparent display panel in response to the display data, and determines a second driving signal required for the light-shielding display panel by classifying the display-unit grayscale value of the display data. In this way, there is no need to set dedicated timing controllers for each display panel, so that the manufacturing cost of the display device can be reduced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for driving a dual-media display panel, implemented by an electronic device including a processor, comprising:
   obtaining a display data by the processor;
   in response to the display data, generating a first driving signal for driving a transparent display panel of the dual-media display panel by the processor; and
   in response to the display data, generating a second driving signal for driving a light-shielding display panel of the dual-media display panel by the processor, which comprising:
   obtaining a display-unit grayscale value for the display data by the processor;
   determining whether the display-unit grayscale value falls within a grayscale value interval by the processor, wherein the grayscale value interval, comprised in a maximum grayscale range, is between an upper limit and a lower limit of the grayscale value interval;
   when the display-unit grayscale value is less than the lower limit, using a driving signal adapted to enabling the light-shielding display panel to display a black color as the second driving signal by the processor; and
   when the display-unit grayscale value is greater than the upper limit, using a driving signal adapted to enabling the light-shielding display panel to display a white color as the second driving signal by the processor.

2. The driving method according to claim 1, wherein the display data is a pixel data comprising a plurality of sub-pixel grayscale values, and the display-unit grayscale value is one of the sub-pixel grayscale values.

3. The driving method according to claim 2, wherein the sub-pixel grayscale values comprises a red sub-pixel grayscale value, a green sub-pixel grayscale value, a blue sub-pixel grayscale value and a white sub-pixel grayscale value, and the display-unit grayscale value is one of the red sub-pixel grayscale value, the green sub-pixel grayscale value and the blue sub-pixel grayscale value.

4. The driving method according to claim 1, wherein the display data is a pixel data comprising a plurality of sub-pixel grayscale values, and the display-unit grayscale value is a weighted average of the sub-pixel grayscale values.

5. The driving method according to claim 4, wherein the sub-pixel grayscale values comprises a red sub-pixel grayscale value, a green sub-pixel grayscale value, a blue sub-pixel grayscale value and a white sub-pixel grayscale value, and the display-unit grayscale value is an average of the red sub-pixel grayscale value, the green sub-pixel grayscale value and the blue sub-pixel grayscale value.

6. The driving method according to claim 1, further comprising:
obtaining a synchronization information by the processor, wherein the synchronization information describes a time difference between a signal transmission time for the transparent display panel and a signal transmission time for the light-shielding display panel; and
delaying outputting the first driving signal or the second driving signal according to the synchronization information by the processor, so as to compensate for the time difference and output the first driving signal and the second driving signal synchronously.

7. The driving method according to claim 1, wherein the display data is a pixel data comprising a plurality of sub-pixel grayscale values, and the driving method further comprises:
determining whether a difference between any two of the sub-pixel grayscale values falls within a specified interval by the processor;
when the difference between any two of the sub-pixel grayscale values falls within the specified interval, using a driving signal adapted to enabling the transparent display panel to appear transparent and colorless as the first driving signal by the processor; and
when the difference between any two of the sub-pixel grayscale values falls outside the specified interval, converting the sub-pixel grayscale values into the first driving signal by the processor.

8. The driving method according to claim 1, further comprising:
when the display-unit grayscale value falls within the grayscale value interval, calculating a complement grayscale value for the display-unit grayscale value and generating the second driving signal according to the complement grayscale value by the processor;
wherein the processor obtains the complement grayscale value by subtracting the display-unit grayscale value from a maximum grayscale value of the maximum grayscale range.

9. The driving method according to claim 1, wherein the electronic device is implemented as a video source configured to provide the display data.

10. An electronic device adapted to driving a dual-media display panel, comprising:
a memory; and
a processor, coupled to the memory, configure to:
obtain a display data;
generate a first driving signal for driving a transparent display panel of the dual-media display panel in response to the display data; and
generate a second driving signal for driving a light-shielding display panel of the dual-media display panel in response to the display data, which comprises:
obtaining a display-unit grayscale value for the display data;
determining whether the display-unit grayscale value falls within a grayscale value interval, wherein the grayscale value interval, comprised in a maximum grayscale range, is between an upper limit and a lower limit of the grayscale value interval;
when the display-unit grayscale value is less than the lower limit, using a driving signal adapted to enabling the light-shielding display panel to display a black color as the second driving signal; and
when the display-unit grayscale value is greater than the upper limit, using a driving signal adapted to enabling the light-shielding display panel to display a white color as the second driving signal.

11. The electronic device according to claim 10, wherein the display data is a pixel data comprising a plurality of sub-pixel grayscale values, and the display-unit grayscale value is one of the sub-pixel grayscale values.

12. The electronic device according to claim 11, wherein the sub-pixel grayscale values comprises a red sub-pixel grayscale value, a green sub-pixel grayscale value, a blue sub-pixel grayscale value and a white sub-pixel grayscale value, and the display-unit grayscale value is one of the red sub-pixel grayscale value, the green sub-pixel grayscale value and the blue sub-pixel grayscale value.

13. The electronic device according to claim 10, wherein the display data is a pixel data comprising a plurality of sub-pixel grayscale values, and the display-unit grayscale value is a weighted average of the sub-pixel grayscale values.

14. The electronic device according to claim 13, wherein the sub-pixel grayscale values comprises a red sub-pixel grayscale value, a green sub-pixel grayscale value, a blue sub-pixel grayscale value and a white sub-pixel grayscale value, and the display-unit grayscale value is an average of the red sub-pixel grayscale value, the green sub-pixel grayscale value and the blue sub-pixel grayscale value.

15. The electronic device according to claim 10, wherein the processor is further configured to:
obtain a synchronization information, wherein the synchronization information describes a time difference between a signal transmission time for the transparent display panel and a signal transmission time for the light-shielding display panel; and
delay outputting the first driving signal or the second driving signal according to the synchronization information, so as to compensate for the time difference and output the first driving signal and the second driving signal synchronously.

16. The electronic device according to claim 10, wherein the display data is a pixel data comprising a plurality of sub-pixel grayscale values, and the processor is further configured to:
determine whether a difference between any two of the sub-pixel grayscale values falls within a specified interval;
when the difference between any two of the sub-pixel grayscale values falls within the specified interval, use a driving signal adapted to enabling the transparent display panel to appear transparent and colorless as the first driving signal; and
when the difference between any two of the sub-pixel grayscale values falls outside the specified interval, convert the sub-pixel grayscale values into the first driving signal.

17. The electronic device according to claim 10, wherein the processor is further configured to:
when the display-unit grayscale value falls within the grayscale value interval, calculate a complement grayscale value for the display-unit grayscale value and generating the second driving signal according to the complement grayscale value;
wherein the processor obtains the complement grayscale value by subtracting the display-unit grayscale value from a maximum grayscale value of the maximum grayscale range.

18. The electronic device according to claim 10, wherein the electronic device is implemented as a video source configured to provide the display data.

19. A display system, comprising:
a video source configured to provide a display data;
a transparent display panel;
a light-shielding display panel stacked on the transparent display panel; and
an electronic device, coupled to the video source, the transparent display panel and the light-shielding display panel, configured to drive the transparent display panel and the light-shielding display panel, comprising:
a memory; and
a processor coupled to the memory and configured to:
obtain the display data;
generate a first driving signal for driving the transparent display panel in response to the display data; and
generate a second driving signal for driving the light-shielding display panel in response to the display data, which comprising:
obtaining a display-unit grayscale value for the display data;
determining whether the display-unit grayscale value falls within a grayscale value interval, wherein the grayscale value interval, comprised in a maximum grayscale range, is between an upper limit and a lower limit of the grayscale value interval;
when the display-unit grayscale value is less than the lower limit, using a driving signal adapted to enabling the light-shielding display panel to display a black color as the second driving signal; and
when the display-unit grayscale value is greater than the upper limit, using a driving signal adapted to enabling the light-shielding display panel to display a white color as the second driving signal.

20. The display system according to claim 19, wherein the transparent display panel is a transparent organic light emitting diode (OLED) display panel, and the light-shielding display panel is a liquid crystal display (LCD) panel or an electrochromic (EC) display panel.

* * * * *